United States Patent
Sze Yuen Lo et al.

(10) Patent No.: US 8,495,456 B2
(45) Date of Patent: *Jul. 23, 2013

(54) COOPERATIVE CONCATENATED CODING FOR WIRELESS SYSTEMS

(75) Inventors: Ernest Sze Yuen Lo, Hong Kong (CN); Khaled Ben Letaif, Hong Kong (CN)

(73) Assignee: Lingna Holdings Pte., LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/455,307

(22) Filed: Apr. 25, 2012

(65) Prior Publication Data
US 2012/0210196 A1 Aug. 16, 2012

Related U.S. Application Data

(63) Continuation of application No. 12/105,319, filed on Apr. 18, 2008, now Pat. No. 8,205,132.

(60) Provisional application No. 60/916,423, filed on May 7, 2007.

(51) Int. Cl.
*H03M 13/00* (2006.01)

(52) U.S. Cl.
USPC .......................................... 714/755; 714/790

(58) Field of Classification Search
USPC ................. 714/752, 755, 776, 790
See application file for complete search history.

(56) References Cited

U.S. PATENT DOCUMENTS

| | | | |
|---|---|---|---|
| 6,323,788 B1 | 11/2001 | Kim et al. | |
| 7,092,457 B1 | 8/2006 | Chugg et al. | |
| 7,975,199 B2 * | 7/2011 | Chindapol et al. | 714/751 |
| 2004/0266339 A1 * | 12/2004 | Larsson | 455/7 |
| 2005/0010854 A1 | 1/2005 | Bickerstaff | |
| 2005/0014464 A1 * | 1/2005 | Larsson | 455/11.1 |
| 2006/0239222 A1 * | 10/2006 | Kim et al. | 370/328 |
| 2007/0070954 A1 * | 3/2007 | Kim et al. | 370/334 |
| 2007/0135152 A1 | 6/2007 | Kim | |
| 2007/0230605 A1 * | 10/2007 | Osseiran et al. | 375/260 |
| 2008/0049718 A1 * | 2/2008 | Chindapol et al. | 370/351 |
| 2008/0123618 A1 * | 5/2008 | Papadopoulos | 370/345 |
| 2008/0134000 A1 * | 6/2008 | Wiatrowski et al. | 714/758 |
| 2008/0155148 A1 | 6/2008 | Oyman | |

(Continued)

OTHER PUBLICATIONS

T. S. Rappaport, "Wireless communications: principles & practice," Prentice Hall, 1st Edition, pp. 299-360, 1998.

(Continued)

*Primary Examiner* — Joshua Lohn
(74) *Attorney, Agent, or Firm* — Turocy & Watson, LLP

(57) ABSTRACT

Cooperative concatenated coding techniques are provided for wireless communications between at least two users and a base station. A network system employing cooperative concatenated coding includes cooperating user devices each configured to encode and transmit at least a potion of a joint message. The joint message includes at least a potion of a first message from a first cooperating user device and at least a potion of a second message from a second cooperating user device. An embodiment includes encoding a first message from a first cooperating user, receiving a second message from a second cooperating user and decoding the second message. The methodology also includes re-encoding at least a potion of the decoded message with at least a potion of the first message to form a combined message, and then transmitting at least a potion of the combined message.

20 Claims, 12 Drawing Sheets

U.S. PATENT DOCUMENTS

2008/0159359 A1* 7/2008 Park et al. .................... 375/211
2008/0240018 A1 10/2008 Xue et al.
2009/0019332 A1* 1/2009 Hekstra et al. ................ 714/752

OTHER PUBLICATIONS

G. J. Foschini and M. J. Gans, "On limits of wireless communications in a fading environment when using multiple antennas," Wireless Personal Commun., vol. 6, pp. 311-335, Mar. 1998.

A. Sendonaris, E. Erkip, and B. Aazhang, "User cooperation diversity, part I: system description," IEEE Trans. Commun., vol. 51, pp. 1927-1938, Nov. 2003.

J. N. Laneman, D. N. C. Tse, and G. W. Wornell, "Cooperative diversity in wireless networks: efficient protocol and outage behaviour," IEEE Trans. Inform. Theory, vol. 50, pp. 3062-3080, Dec. 2004.

T. Cover and E. Gamal, "Capacity theorems for the relay channel," IEEE Trans. Inform. Theory, vol. 25, pp. 572-584, Sep. 1979.

T. E. Hunter and A. Nostratinia, "Cooperation diversity through coding," in Proc. IEEE ISIT'02, Jul. 2002, pp. 220.

T. E. Hunter, S. Sanayei, and A. Nostratinia, "Outage analysis of coded cooperation," IEEE Trans. Inform. Theory, vol. 52, pp. 375-391, Feb. 2006.

A. Stefanov and E. Erkip, "Cooperative coding for wireless networks," IEEE Trans. Commun., vol. 52, pp. 1470-1476, Sep. 2004.

M. Janani, A. Hedayat, T. E. Hunter, and A. Nostratinia, "Coded cooperation in wireless communications: space-time transmission and iterative decoding," IEEE Trans. Signal Processing, vol. 52, pp. 362-371, Feb. 2004.

M. Souryal and B. Vojcic, "Cooperative turbo coding with time-varying rayleigh fading channels," in Proc. IEEE ICC'04, Jun. 2004, pp. 356-360.

Y. Cao and B. Vojcic, "Cooperative coding using serial concatenated convolutional codes," in Proc. IEEE WCNC'05, Mar. 2005, pp. 1001-1006.

S. Vishwanath and A. Goldsmith, "Adaptive turbo-coded modulation for flat-fading channels," IEEE Trans. Commun., vol. 51, pp. 964-972, Jun. 2003.

S. Benedetto and G. Montorsi, "Unveiling turbo codes: some results on parallel concatenated coding schemes," IEEE Trans. Inform Theory, vol. 42, pp. 409-428, Mar. 1996.

S. Bendedetto, D. Divsalar, G. Montorsi, and F. Pollara, "Serial concatenation of interleaved codes: performance analysis, design, and iterative decoding," IEEE Trans. Inform. Theory vol. 44, pp. 909-926, May 1998.

Ernest S. Lo and K. B. Letaief, "Convolutional double accumulate codes with iterative decoding for broadband OFDM wireless communications," in Proc. IEEE ICC' 02, Apr. 2002, pp. 426-430.

OA dated Oct. 3, 2011 for U.S. Appl. No. 12/105,319, 32 pages.

Zhao et al. Distributed Turbo Coded Diversity for Relay Channel, Electronics Letters, vol. 39, No. 10, pp. 786-787; May 15, 2003.

International Search Report and Written Opinion International Application No. PCT/IB2008/003337 dated Mar. 23, 2011, 13 pages.

* cited by examiner

COOPERATIVE CONCATENATED CODING FOR WIRELESS SYSTEMS

CROSS-REFERENCE TO RELATED APPLICATIONS

This application is a continuation of co-pending U.S. patent application Ser. No. 12/105,319, filed on Apr. 18, 2008, entitled "COOPERATIVE CONCATENATED CODING FOR WIRELESS SYSTEMS", which claims priority to U.S. Provisional Application Ser. No. 60/916,423, filed on May 7, 2007, entitled "COOPERATIVE CONCATENATED CODING FOR WIRELESS SYSTEMS". The entireties of all prior-filed applications listed herein are hereby incorporated by reference.

TECHNICAL FIELD

The subject disclosure relates to cooperative concatenated coding for wireless communication systems.

BACKGROUND

In conventional cellular networks, mobile devices communicate individually with the base station and are susceptible to severe channel fading. Diversity techniques in time and frequency have been used to improve system performance but often at the expense of bandwidth efficiency. Multiple-antenna solutions have recently evolved as a further attempt to achieve spatial diversity without sacrificing system bandwidth, however, their feasibility has been largely limited by the device dimensions, especially at the mobile terminals. In view of this, user cooperation has been proposed to achieve spatial diversity by allowing different users to relay messages from the source to the destination.

Three commonly used cooperation strategies are amplify-and-forward (AF), decode-and-forward (DF), and coded cooperation (CC). CC gives an additional coding gain compared to AF and DF. With CC, the relay first decodes the received source message and then re-encodes it into a different set of parity bits before forwarding it to the destination. This is in contrast to AF and DF where the same set of parity bits is present in the forwarded message of the relay. In essence, CC utilizes a more powerful channel code and exploits spatial diversity by transmitting the parity bits through different diversity paths.

While conventional CC can achieve an additional coding gain compared to AF and DF, the improvement over its non-cooperative counterpart employing the same powerful channel code relies solely on the diversity branch provided by the cooperating user. In this regard, the coding gain of CC thus disappears if the cooperating user operates at the same receive signal-to-noise (SNR) ratio at the base station, as will be the case when users share the same mode of modulation and coding configuration and target error rate in an adaptive system with channel knowledge given at the transmitter.

Accordingly, improved systems and methods are desired for CC, which can achieve other potential benefits in addition to the spatial diversity gain. The above-described deficiencies of current designs for CC are merely intended to provide an overview of some of the problems of today's designs, and are not intended to be exhaustive. Other problems with the state of the art and corresponding benefits of CC techniques described herein may become further apparent upon review of the following description of the various non-limiting embodiments.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. The sole purpose of this summary is to present some concepts related to the various exemplary non-limiting embodiments in a simplified form as a prelude to the more detailed description that follows.

In various embodiments, cooperative concatenated coding is provided for wireless communications between at least two users and a base station. In one embodiment, a network system is provided employing cooperative concatenated coding of communications. The network system can include at least two cooperating user devices each configured to encode and transmit at least a potion of a joint message. The joint message includes at least a potion of a first message from a first cooperating user device and at least a potion of a second message from a second cooperating user device.

In other exemplary, non-limiting embodiments, the cooperative concatenated coding methodology includes encoding a first message from a first cooperating user, receiving a second message from a second cooperating user, and decoding the second message. The methodology also includes re-encoding at least a potion of the decoded message with at least a potion of the first message to form a combined message, and then transmitting at least a potion of the combined message.

BRIEF DESCRIPTION OF THE DRAWINGS

The systems and methods for cooperative concatenated coding are further described with reference to the accompanying drawings in which.

DETAILED DESCRIPTION

Overview

As mentioned in the background, improved systems and methods are desired for coded cooperation, which realize other benefits in addition to a potential spatial diversity gain. In various non-limiting embodiments, a coded cooperation architecture is provided where the cooperating users benefit not only from spatial diversity gain, but also from a more powerful joint-user channel code. Using the techniques described herein, an interleaver gain is realized in data communications that increases with the number of cooperating users. This additional performance gain occurs even when the receive SNR of all of the cooperating users are kept the same at the base station. Furthermore, cooperation among more than two users with unequal message sizes is easily achieved with various techniques described herein. Also, in one embodiment, when inter-user channels are determined to be "good" or satisfactory, a reduced-complexity cooperation method can be used.

In accordance with the present description, as a roadmap for what follows, an exemplary cooperative concatenated coding architecture is first described. Delay and complexity considerations are discussed next. Then, some design criteria and code selection are discussed. Next, some performance benefits of the embodiments described herein are quantified by plotting bit error rate using varying block sizes, varying numbers of cooperating users, and a reduced-complexity cooperative encoder. In sum, results of applying the various cooperative concatenated coding techniques herein show that, in addition to the benefit of spatial diversity, significant coding benefits can be achieved compared with operation of naive, conventional cooperation strategies, such as those mentioned in the background. Various other embodiments and underlying concepts are further described in more detail below.

Exemplary Cooperative Coding Architecture

A cooperative code architecture and its features are now described in conjunction with an embodiment providing a cooperative serial concatenated convolutional code (SCCC) as the channel code that comprises a joint-user recursive systematic convolutional (RSC) inner code. Time-division-multiple-access (TDMA) uplink transmission is used with half-duplex communication where users can either transmit or receive at a particular time.

Figure 1:
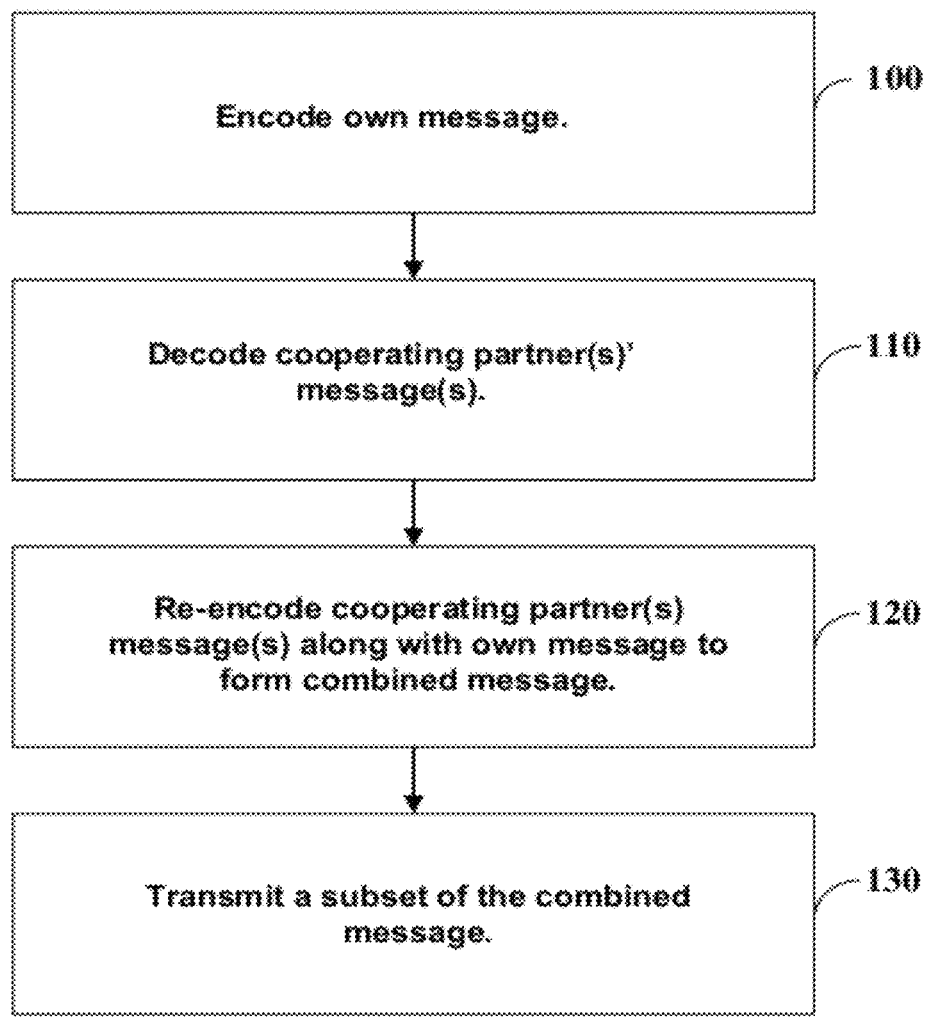
FIG. 1 illustrates a flowchart of a method of cooperative concatenated coding.

FIG. 1 illustrates a flowchart of a method of cooperative concatenated coding in accordance with an exemplary, non-limiting embodiment. At 100, a user device (also referred to herein as a user) encodes its own message. At 110, the user decodes cooperating partner(s)' message(s). At 120, the user re-encodes the cooperating partner(s)' message(s) along with the user's own message to form a combined message. At 130, the user transmits a subset of the combined message.

Figure 2:
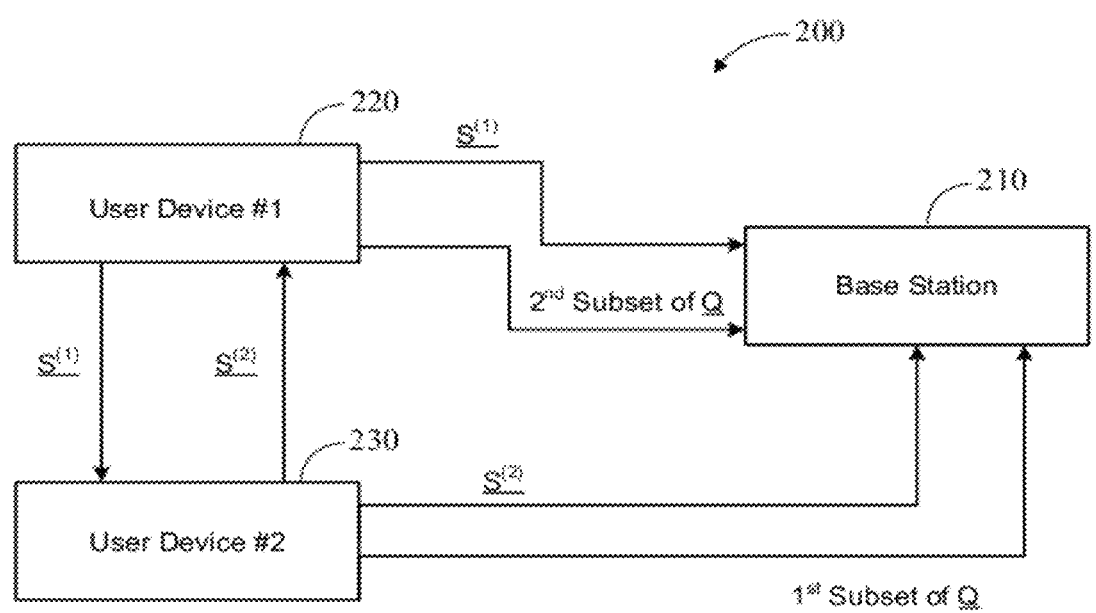
FIG. 2 illustrates a high-level block diagram of a cooperative concatenated coding system.

FIG. 2 illustrates a high-level block diagram of a cooperative concatenated coding system in accordance with another exemplary non-limiting embodiment. In the example illustrated, the cooperative concatenated coding system 200 includes a base station 210 and two cooperating user devices—a first user device 220 and a second user device 230. The base station 210 is operable to receive data transmitted by the first user device 220 and/or by the second user device 230. In the example illustrated, the first user device 220 transmits a first message S1 to the base station, and the second user device 230 transmits a second message S2 to the base station.

In addition, each cooperating user device listens to the channel and attempts to decode the other user device(s)' message(s). Upon successful decoding, a joint message Q is encoded jointly using all cooperating users' messages. Each user device then transmits a subset of Q to the base station. In the example of FIG. 2, only two user devices are illustrated for simplicity's sake; however, it is to be understood that the invention is not limited to two cooperating user devices, but rather any number of cooperating user devices can be used. In addition, although the example of FIG. 2 shows the second user device 230 transmitting the first subset of Q, and the first user device 220 transmitting the second subset of Q, the transmission of particular potions of Q by particular user devices can vary depending on a multitude of factors as contemplated or otherwise referred to herein.

Figure 3:
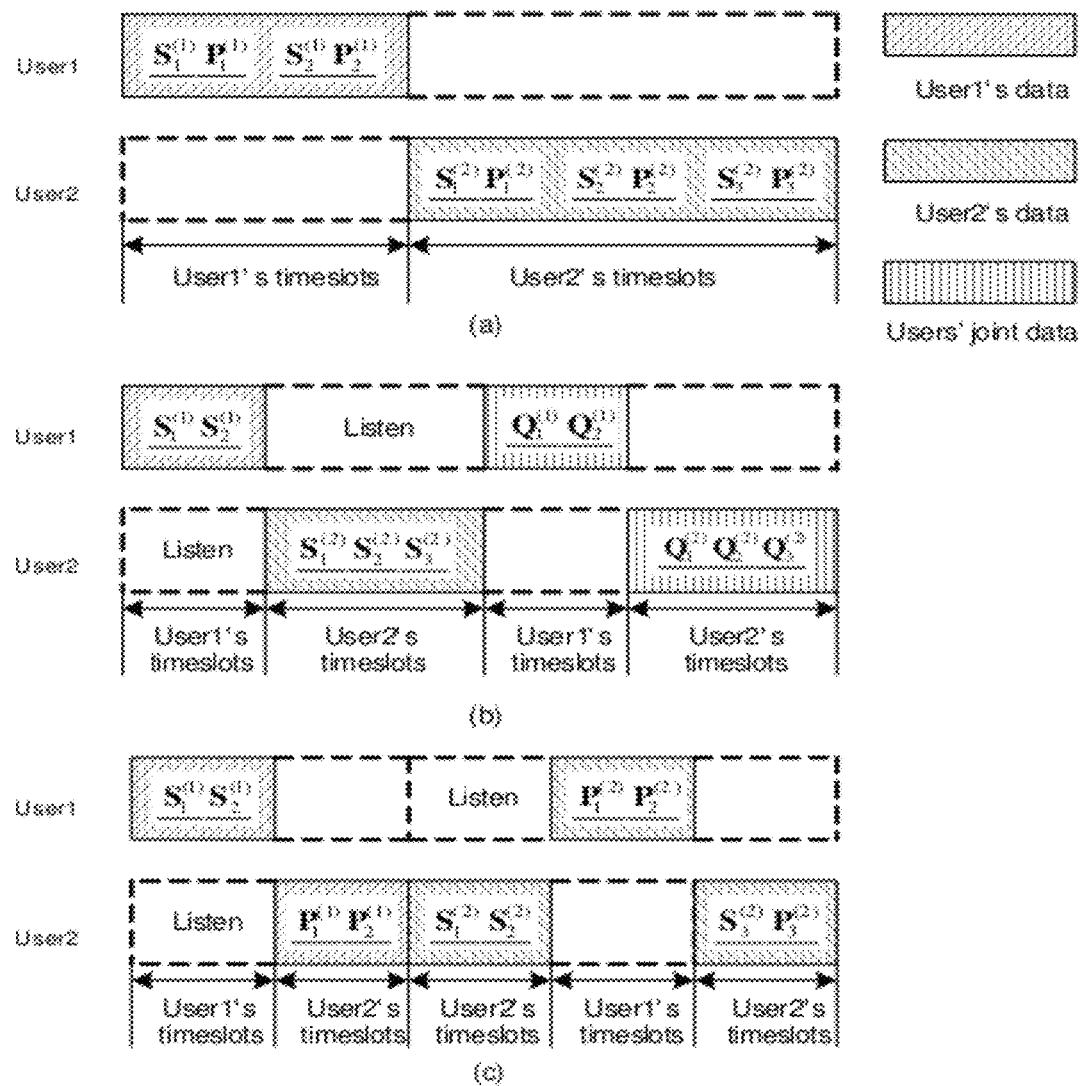
FIG. 3 comparatively illustrates a two-user system with a fixed timeslot allocation ratio using conventional non-cooperation, conventional coded cooperation.

A more detailed two-user example is given in FIG. 3 that demonstrates architectural differences among conventional non-cooperative, conventional coded cooperation, and the various embodiments described herein. In this regard, the selection of SCCC with an RSC inner code according to an embodiment, and other forms of concatenated codes is explained below in more detail. The following notations are used in the following description of the various embodiments.

$X^{(k)} = \{X_1^{(k)}, X_2^{(k)}, \ldots, X_i^{(k)}, \ldots\}$ represents a set of blocks of bits, $X_i^{(k)}$'s, of user k. The coded bits of the ith-coded block of user k are divided into two subsets, denoted by $S_i^{(k)}$ and $P_i^{(k)}$, as shown in FIG. 3. When a general user is referred to herein, the superscript is discarded.

In the subset of FIG. 3 generally designated as "(a)," a conventional non-cooperative scheme is illustrated. In this conventional scheme, each user simply transmits its own data during its own timeslots with no cooperation from other users. A conventional coded cooperation scheme is illustrated in the subset of FIG. 3 generally designated as "(c)," which differs from the non-cooperative approach of "(a)" in that when the source user transmits its first set of coded bits S to the base station, the cooperating partner listens to the channel and attempts to decode the message. Upon successful decoding, the partner re-encodes the message and helps the source user transmit the second set, P, to the base station.

However, when a decoding failure is detected, the scheme either returns to a non-cooperative mode or results in a partly cooperative mode. In the first instance, the failed user informs its partner about the failure, and both of the users then transmit their own P without cooperation. In the second instance, the failed user also transmits its own P instead in the cooperating timeslots, but without informing its partner of the failure. This potentially leads to an additional diversity gain for the failed user on its own P at the expense of the partner's error performance, which is then protected by a weaker (higher code-rate) channel code.

The subset of FIG. 3 in the middle generally designated as "(b)" represents an exemplary, non-limiting embodiment of a coded cooperation architecture. As shown, the coded bits transmitted by the cooperating partners are no longer $P_i$'s of individual users as with subsets "(a)" and "(c)," but rather a new set of coded bits, denoted by $Q^{(All)} = \{Q^{(1)}, Q^{(2)}, \ldots, Q^{(K)}\}$, which are encoded jointly using all K cooperating users' messages. Depending on the number of timeslots allocated, each user transmits a subset of $Q^{(All)}$ accordingly.

A preliminary cooperating group is assumed to be formed prior to the transmissions. The users first transmit their first set of coded bits S equentially, which corresponds to their outer codewords in embodiments using SCCC-based systems. Then, a short period is dedicated to every user to report simultaneously to the cooperating partners and the base station about the occurrence of any decoding failures. Users encountering a decoding failure of any other user's messages can be excluded from the cooperating group and return to their own message encoding. The users then take turns transmitting the next set of coded bits, either their own coded bits or the cooperatively encoded ones.

As mentioned above, in various non-limiting embodiments, the coded cooperation architecture described herein provides another dimension of performance boost in addition to a gain in spatial diversity by exploiting the interleaver gain of concatenated codes. Through user cooperation, the interleaver gain can be increased significantly so that a more powerful overall channel code is formed. In addition, this framework enables cooperative flexibility in terms of the number of cooperating users and message block lengths. The ideas can also be extended to multiple users as shown in subset "(b)" of FIG. 3 or to all users transmitting together. If all users are transmitting together, for instance, channel state information at the transmitters can be used. Asymmetric and arbitrary message block lengths among cooperating users can also be supported, as demonstrated in subsets "(b)" and "(c)", without the need for changing the timeslot allocation ratio.

Figure 4:
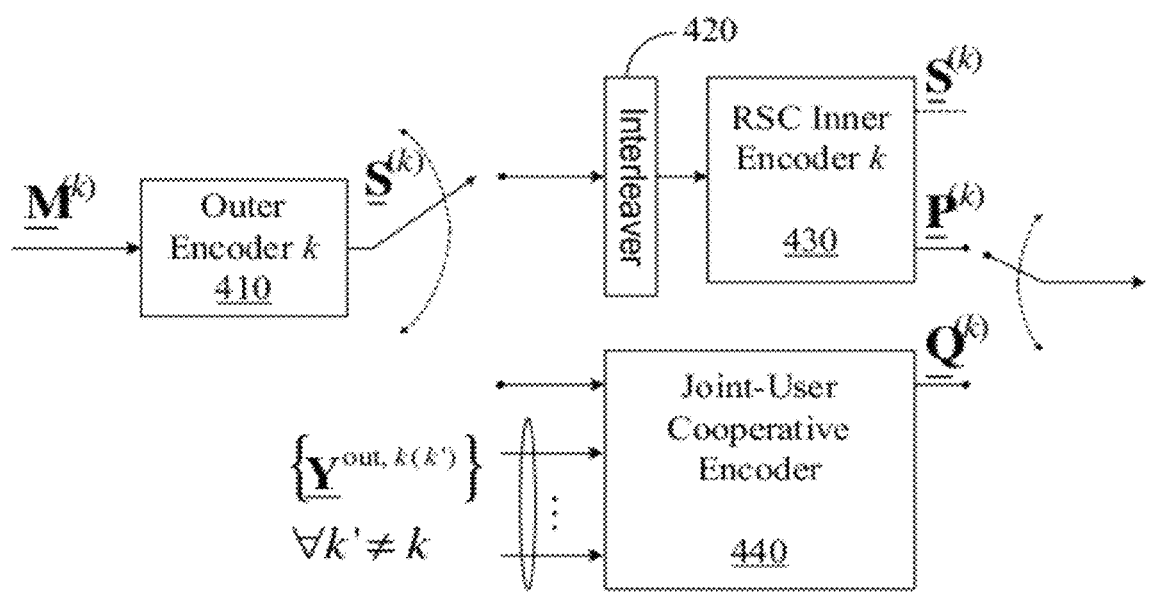
FIG. 4 illustrates a high-level block diagram of a serial concatenated convolution code encoder, including a joint-user cooperative encoder.

SCCC is used in various embodiments of the cooperative code structure, and the encoder for a particular user k is illustrated in FIG. 4. $M^{(k)}$ denotes the user's source messages to be encoded using outer encoder 410, interleaver 420, and RSC inner encoder 430. $Y^{out,k(k')}$ represents the set of outer codeword bits $S^{(k')}$ received from another user k' that passes through a fading channel with additive white Gaussian noise (AWGN). The same or similar interleaver can be adopted in the joint-user cooperative encoder 440 for all users.

Figure 5:
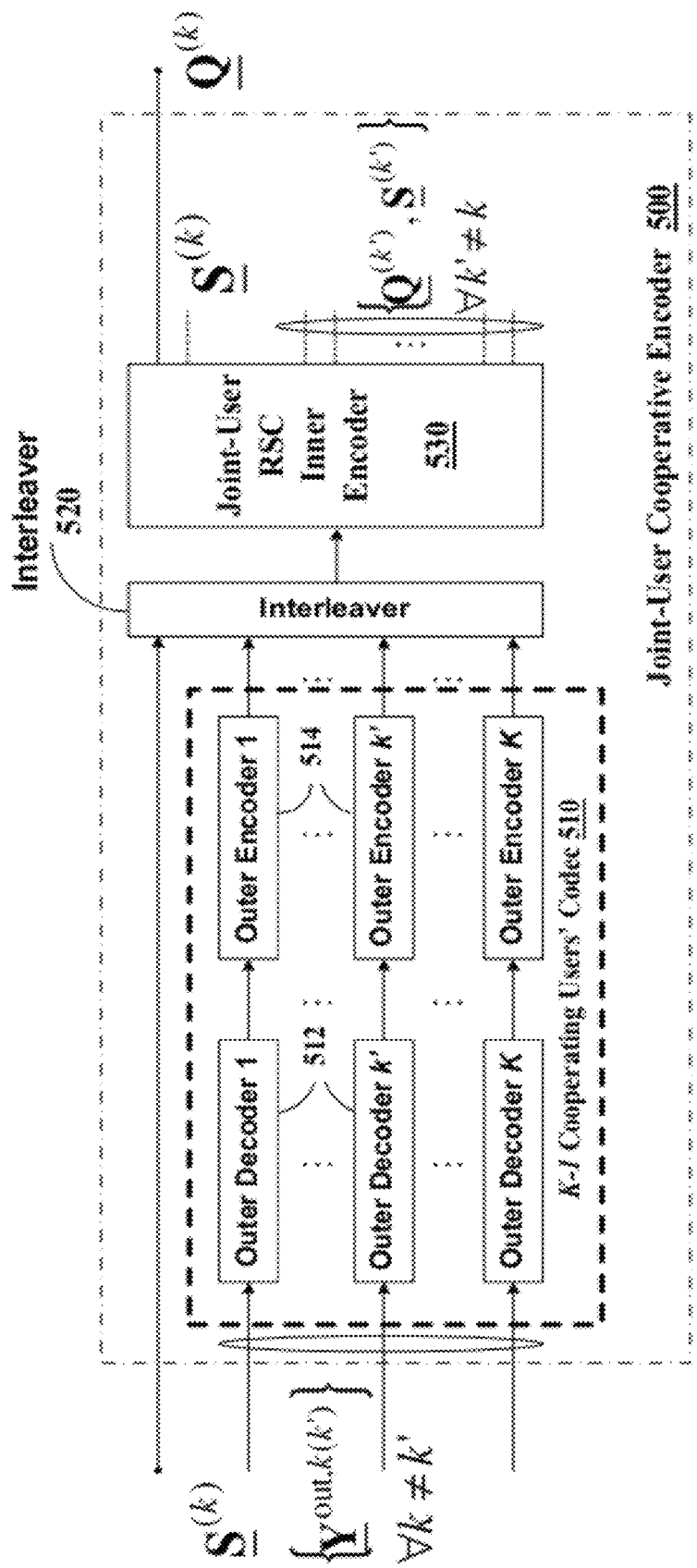
FIG. 5 illustrates a block diagram of the joint-user cooperative encoder of FIG. 4.

Suppose there are K total cooperating users each having all other K-1 users' messages successfully decoded with K-1 cooperating users' codec 510 of the joint-user cooperative encoder 500 shown in FIG. 5. As shown, the S's from all K users can be treated as an equivalent single-user outer codeword per the various outer decoders 512, 514 of codec 510, and then passed through a pseudo-random interleaver 520 before they are encoded using joint-user RSC inner encoder 530. The systematic bits of joint-user RSC inner code 530 represent the outer codewords S's of all users that are already transmitted to the base station by individual users. Therefore, the set of parity bits $Q^{(All)}$ can be the only bits that are transmitted in the cooperating timeslots, with each user transmitting only a subset according to respective numbers of allocated timeslots.

Figure 6:
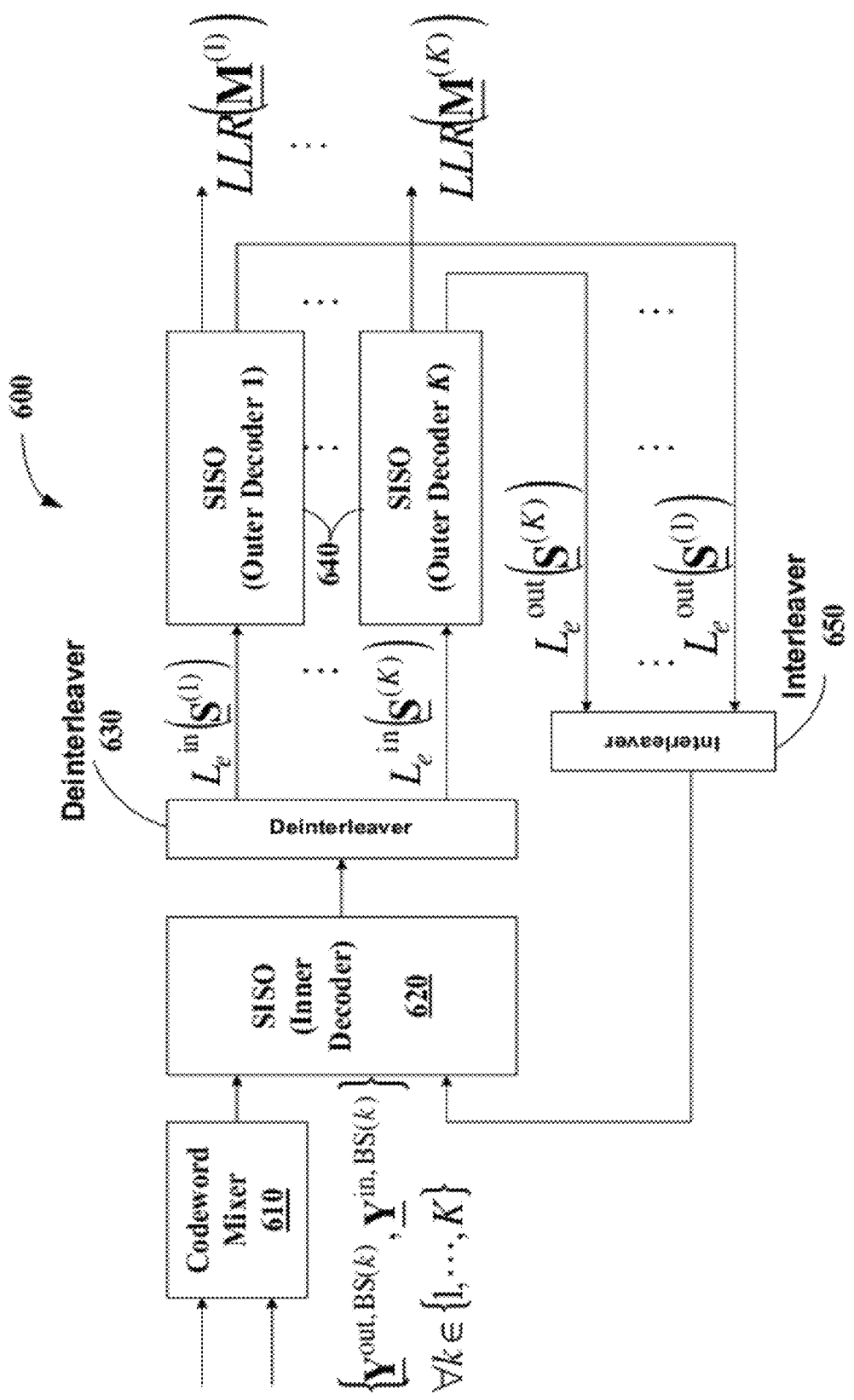
FIG. 6 illustrates a block diagram of an iterative decoder in connection with a cooperative concatenated code.

An exemplary iterative decoder 600 at the base station with single-input-single-output (SISO) component decoders 620 is illustrated in FIG. 6. $Y^{in,BS(k)}$ and $Y^{out,BS(k)}$ represent the sets of inner codeword bits $Q^{(k)}$ and outer codeword bits $S^{(k)}$ received from user k at the base station, respectively. They are first passed through a codeword mixer 610 that rearranges the bits into proper positions of the corresponding codeword sequence of the joint-user inner code before feeding them into the inner SISO decoder 620 and deinterleaver 630. $L_e^{in}(S^{(k)})$ represents the extrinsic information of $S^{(k)}$ output from deinterleaver 630. $L_e^{out}(S^{(k)})$ resents the extrinsic information of $S^{(k)}$ output from the outer SISO decoder k 640. LLR ($M^{(k)}$) is the a posteriori information of user k's messages from which decisions can be made.

Delay and Complexity Considerations

In many systems, there is often a trade-off among error performance gain, message delay, and implementation complexity. In this regard, a trade-off for error rate improvement is users' input decoding delay, which can be defined as the time period starting from a user's message being input into the encoder until the output of a corresponding valid codeword from which the message is to be recovered. Since the inner codeword is jointly encoded from all users' messages, the maximum input decoding delay $D^{max}$ is experienced by the first transmitting user and is characterized by Equation (1):

$$D^{max} = \sum_{k=1}^{K} T_k \qquad (1)$$

where $T_k$ is the total time period scheduled for cooperating user k for its message blocks in a K-user cooperation framework. When users have the same message block size, the maximum delay is directly propotional to the number of cooperating users. Nevertheless, since cooperation is often carried out within a frame, this input delay is upper-bounded by only a frame and is usually preferable to the delay experienced by re-transmissions in non-cooperative systems. The extended decoding delay at the base station induced by cooperation is assumed negligible compared to the single-user scenario in view of the large processing power available there.

In terms of complexity, the major increase for every user lies on the additional K-1 cooperating users' outer decoders 512, 514, as depicted in FIG. 5. This is a reasonable constraint for coded cooperation architectures where user(s) attempt to decode partner message(s) successfully before re-encoding into a different set of parity bits. In accordance with another aspect, embodiments described herein further reduce the overall complexity of the system. For instance, in one embodiment, when the inter-user channels are of acceptable quality, the K-1 cooperating users' outer decoders, together with the corresponding encoders, can simply be replaced by K-1 demodulators where hard-decisions are made directly on the received $Y^{out,k(k+)}$'s. This reduction in complexity is not possible in many conventional systems. Moreover, in conventional systems with cooperation based on punctured concatenated codes, the complexity issue is substantial where iterative decoders are required at the helping partner.

Some Design Criteria and Code Selection

In addition to spatial diversity and a reduction in complexity, an interleaver gain can be achieved that increases with the number of cooperating users. To achieve this type of interleaver gain, a first issue is whether to use parallel or serial concatenation codes. Both Turbo codes and SCCC achieve an interleaver gain, which has the following relationship with the bit error rate (BER) $P_b$ at high SNR for a given interleaver size N, as shown in Equation (2):

$$P_b \propto N^{\alpha_M} \qquad (2)$$

where $N^{\alpha_M}$ is the interleaver gain and $\alpha_M$ the maximum exponent achieved depending on the code structure and characteristics of the component codes. In this regard, $\alpha_M = -1$ is always true for using a Turbo code while for SCCC the maximum exponent is given by Equation (3):

$$\alpha_M = -\left\lfloor \frac{d_f^o + 1}{2} \right\rfloor \qquad (3)$$

with $d_f^o$ denoting the free distance of the outer code and $\lfloor x \rfloor$ the integer part of x. Therefore, SCCC is an optional alternative to using a Turbo code.

In addition, with respect to codeword separability, if a code is to be used for coded cooperation, the codewords can be partitioned into two sets as described above where the first set is powerful enough for partners to decode the message, as well as the overall code. As mentioned, the interleaver gain can be improved by user cooperation. Therefore, in general, the users' messages can be jointly encoded in some ways at each cooperating user after the first sets received from their partners being decoded. The chosen code(s) favor this operation so that the individually encoded first sets and the jointly encoded second sets from all cooperating users together form a robust concatenated code with an improved interleaver gain.

As mentioned above, in one embodiment, an SCCC structure with a systematic inner code (e.g., a joint user RSC) can be adopted. As described, in this embodiment, each user's outer codeword serves as their first set S and is combined with other users' S's after successfully decoding and re-encoding to form a larger outer codeword for the joint-user SCCC. In one embodiment with the RSC inner code, only the parity bits of the joint-user inner codeword are required to serve as the second set $^{(All)}$. The combined codeword is similar to an ordinary single-user SCCC codeword with an enlarged input data block adopting a larger interleaver. However, the equivalent outer code is a concatenation of the cooperating users' outer codes. The equivalent input-output weight enumerating function (IOWEF) $A^{C_o}(W,H)$ is expressed by Equation (4):

$$A^{C_o}(W, H) = \prod_{k=1}^{K} A^{C_o,k}(W, H) = \prod_{k=1}^{K} \sum_{w} \sum_{h} A^{C_o,k}_{w,h} W^w H^h \quad (4)$$

where $A^{C_o,k}(W,H)$ is the IOWEF of the equivalent block code of user k's outer convolutional code and $A_{w,h}^{C_o,k}$ denotes the number of codewords with weight h generated by input words of weight w. Therefore, the minimum Hamming weight of codewords of the equivalent outer code can be given by Equation (5):

$$d_f^o = \min_k d_f^{o,k} \quad (5)$$

with $d_f^{o,k}$ referring to the free distance of user k's outer convolutional code. Due to space limitation, the exact analysis of this cooperative code is not discussed herein. The analysis is a bit different from the SCCC for the different nature of the equivalent outer code. However, it can be shown that the maximum exponent of N, i.e., the interleaver size, of an SCCC with such an equivalent outer code will be upper-bounded by Equation (3) using Equation (5). Hence, it suffices to use Equations (3) and (5) as design criteria where the corresponding interleaver gain specified can be guaranteed.

As mentioned above, both the overall equivalent code and the individual component code should be good codes. Therefore, a desired code should feature a significant improvement of the overall code at the same time when the component code is improved. SCCC is a good option because its interleaver gain is characterized by only the free distance of the equivalent outer code as shown in Equations (3) and (5) provided that the inner code is recursive. In addition, conventional systems have demonstrated that a simple inner code is sufficient for delivering great error performance in both AWGN and fading channels. This implies that the additional decoding complexity due to the extended input block size in user cooperation can be kept minimal, which is shown by the joint-user inner decoder in FIG. 6.

Quantification of Exemplary Performance Benefits

Figure 7:
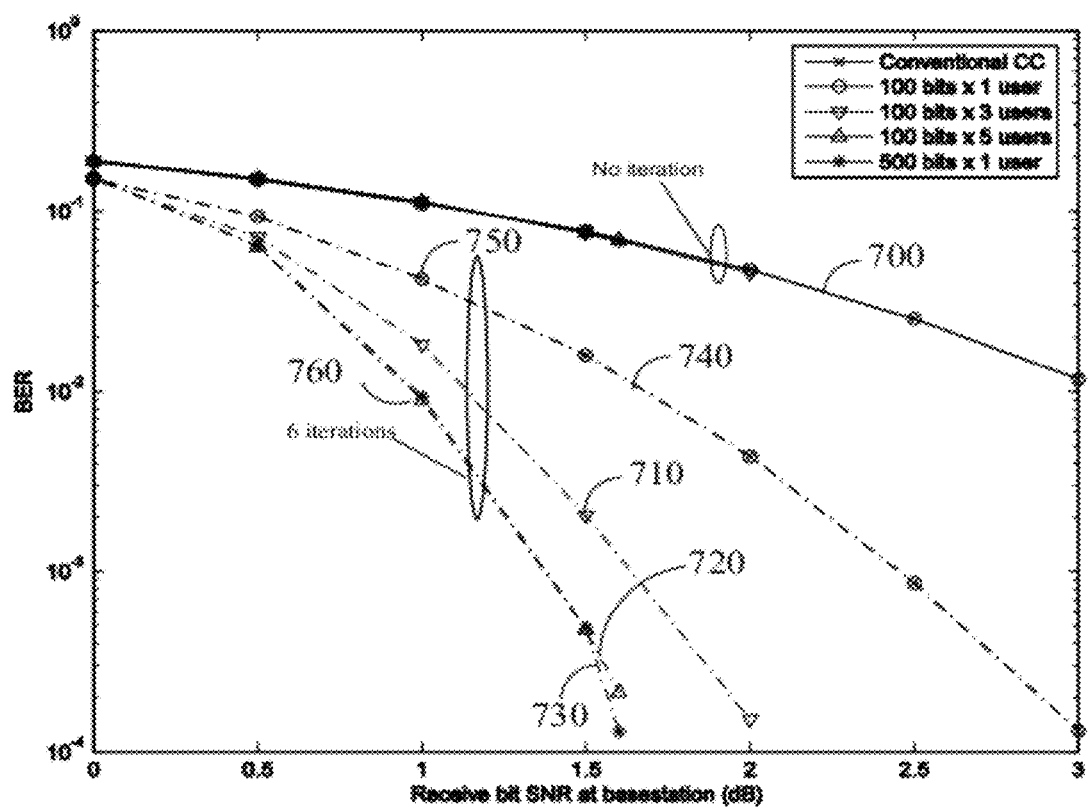
FIG. 7 shows the bit error rate for different number of users in a spatial-diversity deficient scenario.
Figure 8:
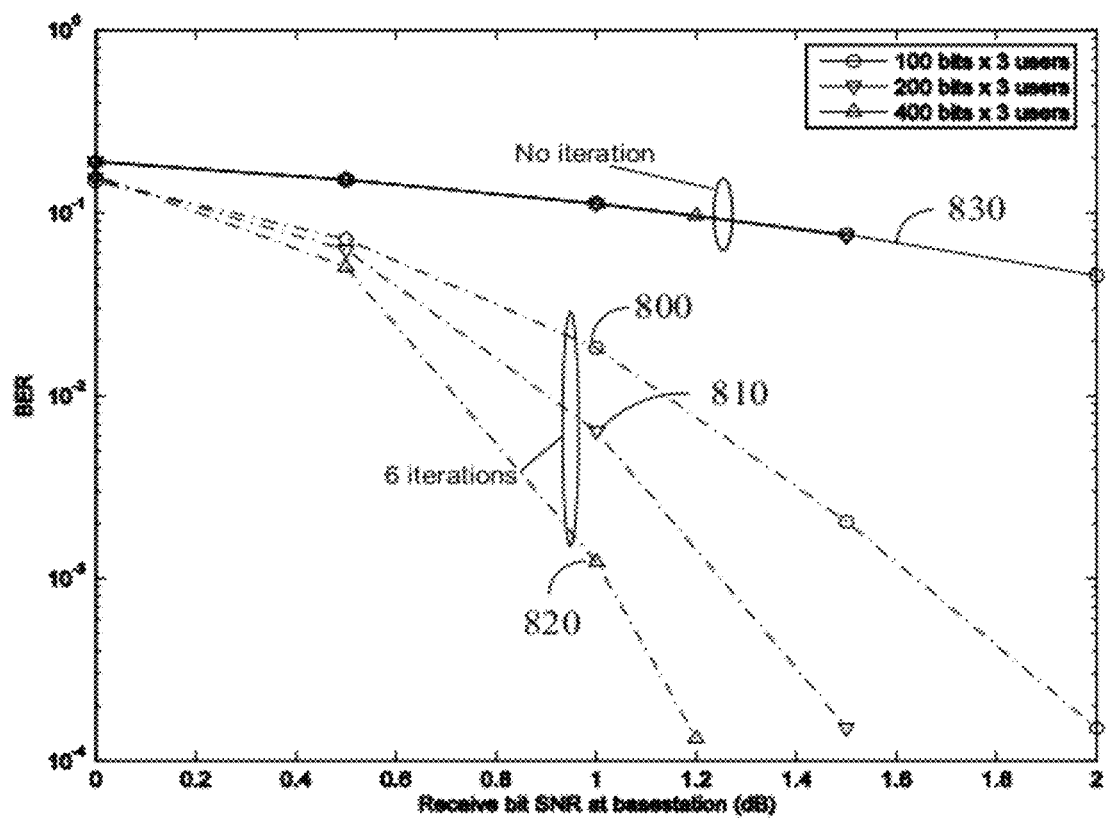
FIG. 8 shows the bit error rate with three cooperating users for different input block sizes in a spatial-diversity deficient scenario.
Figure 9:
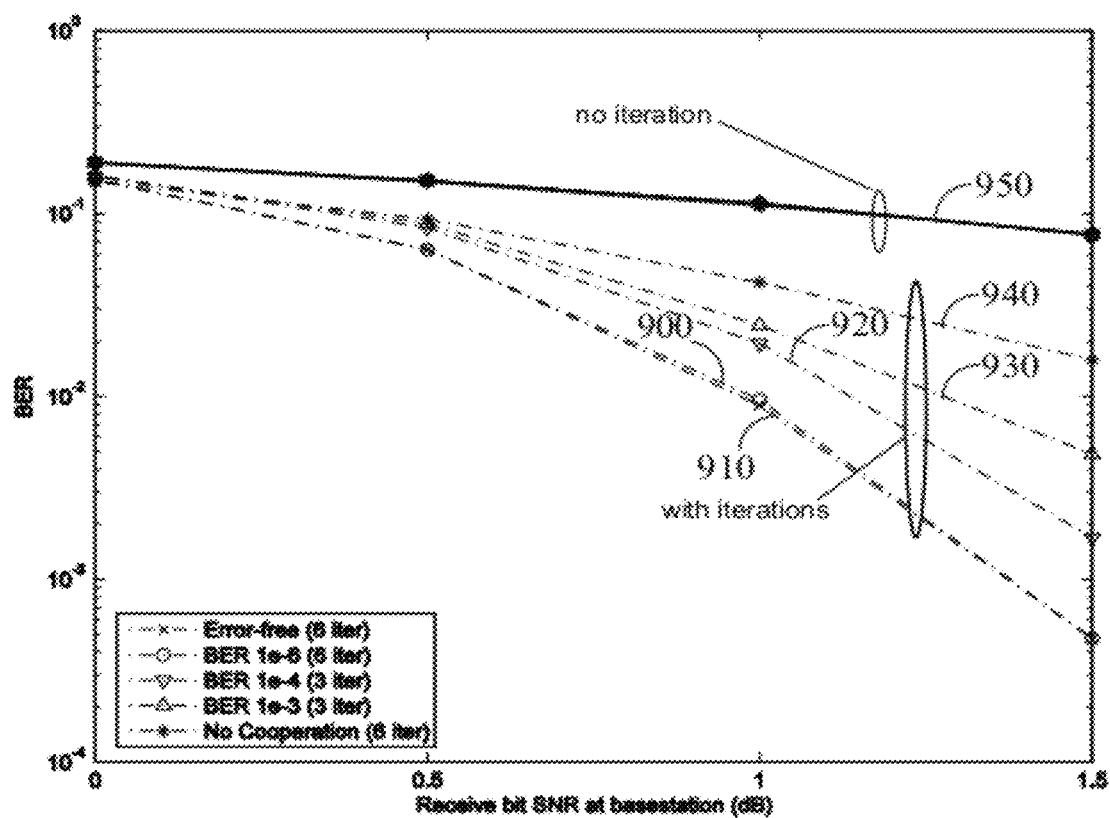
FIG. 9 shows the bit error rate for different inter-user channel conditions with a reduced-complexity cooperative encoder in a spatial-diversity deficient scenario.

FIGS. 7 and 8 show the performance of an embodiment of the cooperative coding architecture for different numbers of cooperative users and input block sizes, respectively. Quasi-static fading is assumed where the channels are constant during the transmissions. In order to better illustrate the features of this embodiment, the scenario of an adaptive system is considered where the receive SNRs of all users are kept constant at the base station. In many conventional coded cooperation systems, the architecture will be reduced to the single-user case when spatial diversity is not available. FIG. 9 shows an embodiment of the reduced-complexity cooperative encoding structure for different inter-user channel conditions. In each of FIGS. 7-9, a rate-⅓ SCCC is adopted for all users with a 4-state outer code and a 4-state inner code (in observer canonical form) that are characterized by the generating matrices Gout and Gin, respectively, as $$G_{out} = [1 + D + D^2, 1 + D^2],$$

$$G_{in} = \begin{bmatrix} 1, & 0, & \frac{1+D^2}{1+D+D^2} \\ 0, & 1, & \frac{1+D}{1+D+D^2} \end{bmatrix}.$$

The free distance of the outer code is 5 that corresponds to an interleaver gain of $N^{-3}$. In this architecture, N corresponds to the total length of all outer codewords from the users. Quadrature phase shift keying (QPSK) is chosen in one embodiment as the modulation scheme in which each orthogonal channel carries one independent coded bit. The inter-user channel is assumed perfect unless otherwise specified. In practice, coded cooperation is desired when inter-user channels are reasonably good. Suppose that the inter-user channels are independent. For a given frame error rate (FER) for the inter-user channels, the probability of full cooperation among K users is $$Pr(\text{full cooperation among } K \text{ users}) = (1 - \text{FER})^{K(K-1)} \quad (6)$$

which is sufficiently high, for example, when FER=0.01 with 5 cooperating users that correspond to a two-order error rate reduction.

In the example of FIG. 7, it can be observed that the error rate is significantly reduced by user cooperation over conventional CC as represented by curve 700. Although the interleaver gain refers to the performance of maximum-likelihood (ML) decoding, a similar gain can be obtained for an iterative decoder with only 6 iterations starting from 1.5 dB. Referring to curve 710 with 3 users cooperating with each other, and comparing to curve 740 with 1 user, the BER is reduced from $2 \times 10^{-2}$ to $2 \times 10^{-3}$ (~1-order gain) and is further reduced to $4 \times 10^{-4}$ (~2-order gain) when two more users participate in the cooperative transmission, as shown by curve 720, which are close to the predicted curves. The configuration of a single user with 500 input bits is also given by curve 730 as a reference for the case of 5-user cooperation in order to study the effect of difference in their equivalent outer codes as discussed earlier. In this example, they share the same interleaver size and achieve apparently the same BERs.

As shown in the example of FIG. 8, when the block size is increased, the performance gain in BER follows the same trend of that obtained by increasing the number of cooperating users. As indicated by (3), the interleaver gain is proportional to the number of times the overall block size is increased. However, in general, there are some SNR thresholds for the interleaver gain to become prominent for different total input block size (interleaver size), as illustrated in FIG.

7 and FIG. 8. As shown by curve points 800, 810 and 820, at 1dB, from curve 800 to curve 810, there is almost a 1-order gain from input block size of 100 bits to 200 bits (2 times), and from curve 800 to curve 820, there is more than a 1-order gain from input block size of 100 bits to 400 bits (4 times). However, it can be observed in FIG. 7 at curve points 750 and 760 that a smaller gain (<1 order) is achieved even when the number of users is increased from one to five (5 times). This suggests that the importance of interleaver gain on the overall performance starts earlier at lower SNR for larger input block sizes. Curve 830 is illustrated in FIG. 8 to compare the case of no iterations to the case of 6 iterations of curves 800, 810 and 820.

For one embodiment of the reduced-complexity cooperative encoder discussed earlier, hard decisions are made directly on the outer codeword bits from all users when cyclic redundancy checks cannot be performed. Therefore, they are subject to the AWGN and a constant fading during the transmission, which can result in independent and identically distributed (i.i.d.) errors. In FIG. 9, an embodiment of a coded cooperation is evaluated with an exemplary reduced-complexity cooperative encoder for various inter-user channels conditions in terms of their uncoded BERs. At uncoded BER $10^{-6}$, the performance is essentially the same at curve 900 as the case of perfect inter-user channels at curve 910. When the uncoded BER is $10^{-4}$ or $10^{-3}$ at curves 920 and 930, a gain of one order can generally still be achieved. However, error propagation can become a serious issue in this situation, or can become even worse in the inter-user situation. Divergence occurs when the number of iterations is more than three, which results in degraded performance. At higher SNR error, a floor may arise due to the error propagation issue. Curve 940 is presented for comparison as the case of no cooperation, with 6 iterations, and curve 950 is representative of the case with no iteration.

As demonstrated in the examples of FIGS. 7-9, the cooperative coding architecture described in various embodiments achieves attractive error performance gain over conventional systems. The gain becomes larger by increasing either the number of cooperating users or the input block size. This gain can be achieved by an iterative decoder using only limited number of iterations, e.g., 4 iterations in the examples. With only five users in cooperation, for example, the bit error rate can be reduced by two orders for BERs ($10^{-3}$ and lower) of practical interest. Moreover, a similar improved trend is obtained for the frame error rates using the techniques described herein.

Conclusion

In various non-limiting embodiments, a cooperative concatenated coding strategy is provided for a multi-user wireless network. The techniques include additional coding benefits other than spatial diversity, in contrast to conventional systems where spatial diversity from different cooperating users is required for a performance improvement. Specifically, a remarkable reduction in error rate can be achieved even when the receive SNR of all cooperating users is maintained at a specific level at the base station, such as in an adaptive transmission system. The idea of interleaver gain of concatenated codes is adopted and a significant reduction in error rate can be achieved by increasing the number of cooperating users.

As described, multiple cooperating users with unequal message sizes can be supported in the cooperating framework, without affecting the fairness among users in terms of number of channels (timeslots) allocated. A reduced-complexity cooperative encoding structure is also provided for use when the inter-user channels are determined to be of sufficient quality, i.e., meet pre-set criteria for use. Code design criteria and the selection of an appropriate code were studied and SCCC with an RSC inner code was shown to be an effective candidate. The performance was evaluated in the scenario of an adaptive transmission system where the conventional coded cooperation strategy does not deliver any performance improvement over its non-cooperative counterpart. For instance, a two-order bit error rate reduction was achieved with a simple rate ⅓ serial concatenated code when five users were cooperating. Even with only two users, error rate is reduced by at least one order in such scenario.

Exemplary Computer Networks and Environments

One of ordinary skill in the art can appreciate that the various embodiments of cooperative concatenated coding described herein can be implemented in connection with any computer or other client or server device, which can be deployed as part of a computer network or in a distributed computing environment, and can be connected to any kind of data store. In this regard, the various embodiments described herein can be implemented in any computer system or environment having any number of memory or storage units, and any number of applications and processes occurring across any number of storage units. This includes, but is not limited to, an environment with server computers and client computers deployed in a network environment or a distributed computing environment, having remote or local storage.

Distributed computing provides sharing of computer resources and services by communicative exchange among computing devices and systems. These resources and services include the exchange of information, cache storage and disk storage for objects, such as files. These resources and services also include the sharing of processing power across multiple processing units for load balancing, expansion of resources, specialization of processing, and the like. Distributed computing takes advantage of network connectivity, allowing clients to leverage their collective power to benefit the entire enterprise. In this regard, a variety of devices may have applications, objects or resources that may implement one or more aspects of cooperative concatenated coding as described for various embodiments of the subject disclosure.

Figure 10:
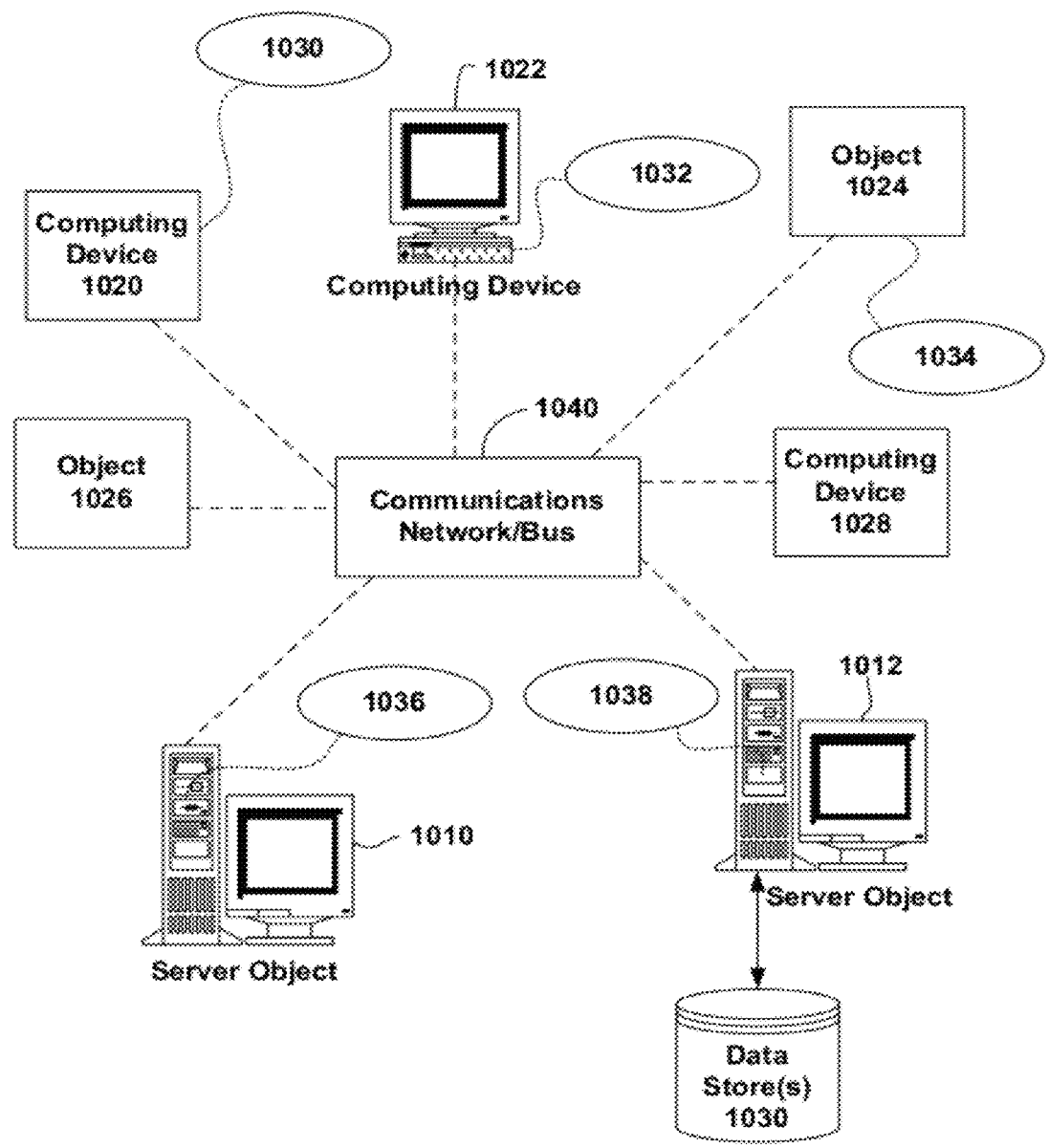
FIG. 10 is a block diagram representing an exemplary non-limiting networked environment in which various embodiments described herein can be implemented.

FIG. 10 provides a schematic diagram of an exemplary networked or distributed computing environment. The distributed computing environment comprises computing objects 1010, 1012, etc. and computing objects or devices 1020, 1022, 1024, 1026, 1028, etc., which may include programs, methods, data stores, programmable logic, etc., as represented by applications 1030, 1032, 1034, 1036, 1038. It can be appreciated that objects 1010, 1012, etc. and computing objects or devices 1020, 1022, 1024, 1026, 1028, etc. may comprise different devices, such as PDAs, audio/video devices, mobile phones, MP3 players, personal computers, laptops, etc.

Each object 1010, 1012, etc. and computing objects or devices 1020, 1022, 1024, 1026, 1028, etc. can communicate with one or more other objects 1010, 1012, etc. and computing objects or devices 1020, 1022, 1024, 1026, 1028, etc. by way of the communications network 1040, either directly or indirectly. Even though illustrated as a single element in FIG. 10, network 1040 may comprise other computing objects and computing devices that provide services to the system of FIG. 10, and/or may represent multiple interconnected networks, which are not shown. Each object 1010, 1012, etc. or 1020, 1022, 1024, 1026, 1028, etc. can also contain an application, such as applications 1030, 1032, 1034, 1036, 1038, that might make use of an API, or other object, software, firmware and/or hardware, suitable for communication with or implementation of the cooperative concatenated coding architecture(s) provided in accordance with various embodiments of the subject disclosure.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the cooperative concatenated coding as described in various embodiments.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service without having to "know" any working details about the other program or the service itself.

In a client/server architecture, particularly a networked system, a client is usually a computer that accesses shared network resources provided by another computer, e.g., a server. In the illustration of FIG. 10, as a non-limiting example, computers 1020, 1022, 1024, 1026, 1028, etc. can be thought of as clients and computers 1010, 1012, etc. can be thought of as servers where servers 1010, 1012, etc. provide data services, such as receiving data from client computers 1020, 1022, 1024, 1026, 1028, etc., storing of data, processing of data, transmitting data to client computers 1020, 1022, 1024, 1026, 1028, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques for performing cooperative concatenated coding can be provided standalone, or distributed across multiple computing devices or objects.

In a network environment in which the communications network/bus 1040 is the Internet, for example, the servers 1010, 1012, etc. can be Web servers with which the clients 1020, 1022, 1024, 1026, 1028, etc. communicate via any of a number of known protocols, such as the hypertext transfer protocol (HTTP). Servers 1010, 1012, etc. may also serve as clients 1020, 1022, 1024, 1026, 1028, etc., as may be characteristic of a distributed computing environment.

Exemplary Computing Device

Figure 11:
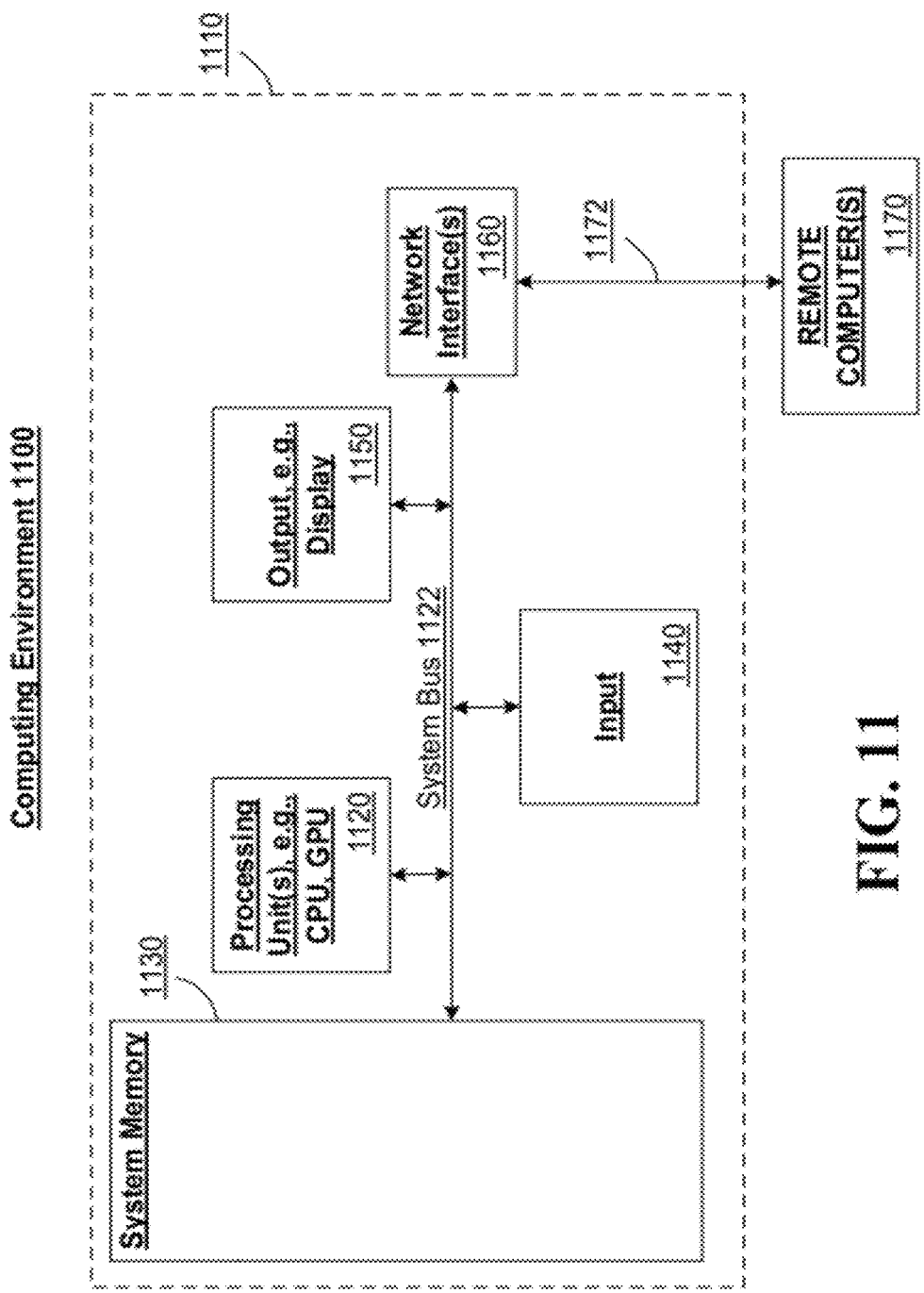
FIG. 11 is a block diagram representing an exemplary non-limiting computing system or operating environment in which various embodiments described herein can be implemented.

As mentioned, advantageously, the techniques described herein can be applied to any device where it is desirable to transmit data from a set of cooperating users. It should be understood, therefore, that handheld, portable and other computing devices and computing objects of all kinds are contemplated for use in connection with the various embodiments, i.e., anywhere that a device may wish to transmit (or receive) data. Accordingly, the below general purpose remote computer described below in FIG. 11 is but one example of a computing device. Additionally, any of the embodiments implementing the cooperative concatenated coding as described herein can include one or more aspects of the below general purpose computer.

Although not required, embodiments can partly be implemented via an operating system, for use by a developer of services for a device or object, and/or included within application software that operates to perform one or more functional aspects of the various embodiments described herein. Software may be described in the general context of computer-executable instructions, such as program modules, being executed by one or more computers, such as client workstations, servers or other devices. Those skilled in the art will appreciate that computer systems have a variety of configurations and protocols that can be used to communicate data, and thus, no particular configuration or protocol should be considered limiting.

FIG. 11 thus illustrates an example of a suitable computing system environment 1100 in which one or aspects of the embodiments described herein can be implemented, although as made clear above, the computing system environment 1100 is only one example of a suitable computing environment and is not intended to suggest any limitation as to scope of use or functionality. Neither should the computing environment 1100 be interpreted as having any dependency or requirement relating to any one or combination of components illustrated in the exemplary operating environment 1100.

With reference to FIG. 11, an exemplary remote device for implementing one or more embodiments includes a general purpose computing device in the form of a computer 1110. Components of computer 1110 may include, but are not limited to, a processing unit 1120, a system memory 1130, and a system bus 1122 that couples various system components including the system memory to the processing unit 1120.

Computer 1110 typically includes a variety of computer readable media and can be any available media that can be accessed by computer 1110. The system memory 1130 may include computer storage media in the form of volatile and/or nonvolatile memory such as read only memory (ROM) and/or random access memory (RAM). By way of example, and not limitation, memory 1130 may also include an operating system, application programs, other program modules, and program data.

A user can enter commands and information into the computer 1110 through input devices 1140. A monitor or other type of display device is also connected to the system bus 1122 via an interface, such as output interface 1150. In addition to a monitor, computers can also include other peripheral output devices such as speakers and a printer, which may be connected through output interface 1150.

The computer 1110 may operate in a networked or distributed environment using logical connections to one or more other remote computers, such as remote computer 1170. The remote computer 1170 may be a personal computer, a server, a router, a network PC, a peer device or other common network node, or any other remote media consumption or transmission device, and may include any or all of the elements described above relative to the computer 1110. The logical connections depicted in FIG. 11 include a network 1172, such local area network (LAN) or a wide area network (WAN), but may also include other networks/buses. Such networking environments are commonplace in homes, offices, enterprise-wide computer networks, intranets and the Internet.

Exemplary Communications Networks and Environments

The above-described optimizations may be applied to any network, however, the following description sets forth some exemplary telephony radio networks and non-limiting operating environments for incorporation of the various embodiments described herein. The below-described operating environments should be considered non-exhaustive, however, and thus the below-described network architecture merely shows one network architecture into which the various embodiments described herein may be incorporated. One can appreciate, however, that the embodiment(s) may be incorporated into any now existing or future alternative architectures for communication networks as well.

The global system for mobile communication ("GSM") is one of the most widely utilized wireless access systems in today's fast growing communication systems. GSM provides circuit-switched data services to subscribers, such as mobile telephone or computer users. General Packet Radio Service ("GPRS"), which is an extension to GSM technology, introduces packet switching to GSM networks. GPRS uses a packet-based wireless communication technology to transfer high and low speed data and signaling in an efficient manner. GPRS optimizes the use of network and radio resources, thus enabling the cost effective and efficient use of GSM network resources for packet mode applications.

As one of ordinary skill in the art can appreciate, the exemplary GSM/GPRS environment and services described herein can also be extended to 3G services, such as Universal Mobile Telephone System ("UMTS"), Frequency Division Duplexing ("FDD") and Time Division Duplexing ("TDD"), High Speed Packet Data Access ("HSPDA"), cdma2000 1x Evolution Data Optimized ("EVDO"), Code Division Multiple Access-2000 ("cdma2000 3x"), Time Division Synchronous Code Division Multiple Access ("TD-SCDMA"), Wideband Code Division Multiple Access ("WCDMA"), Enhanced Data GSM Environment ("EDGE"), International Mobile Telecommunications-2000 ("IMT-2000"), Digital Enhanced Cordless Telecommunications ("DECT"), etc., as well as to other network services that shall become available in time. In this regard, the techniques described herein may be applied independently of the method of data transport, and need not depend on any particular network architecture, or underlying protocols, except where specified otherwise.

Figure 12:
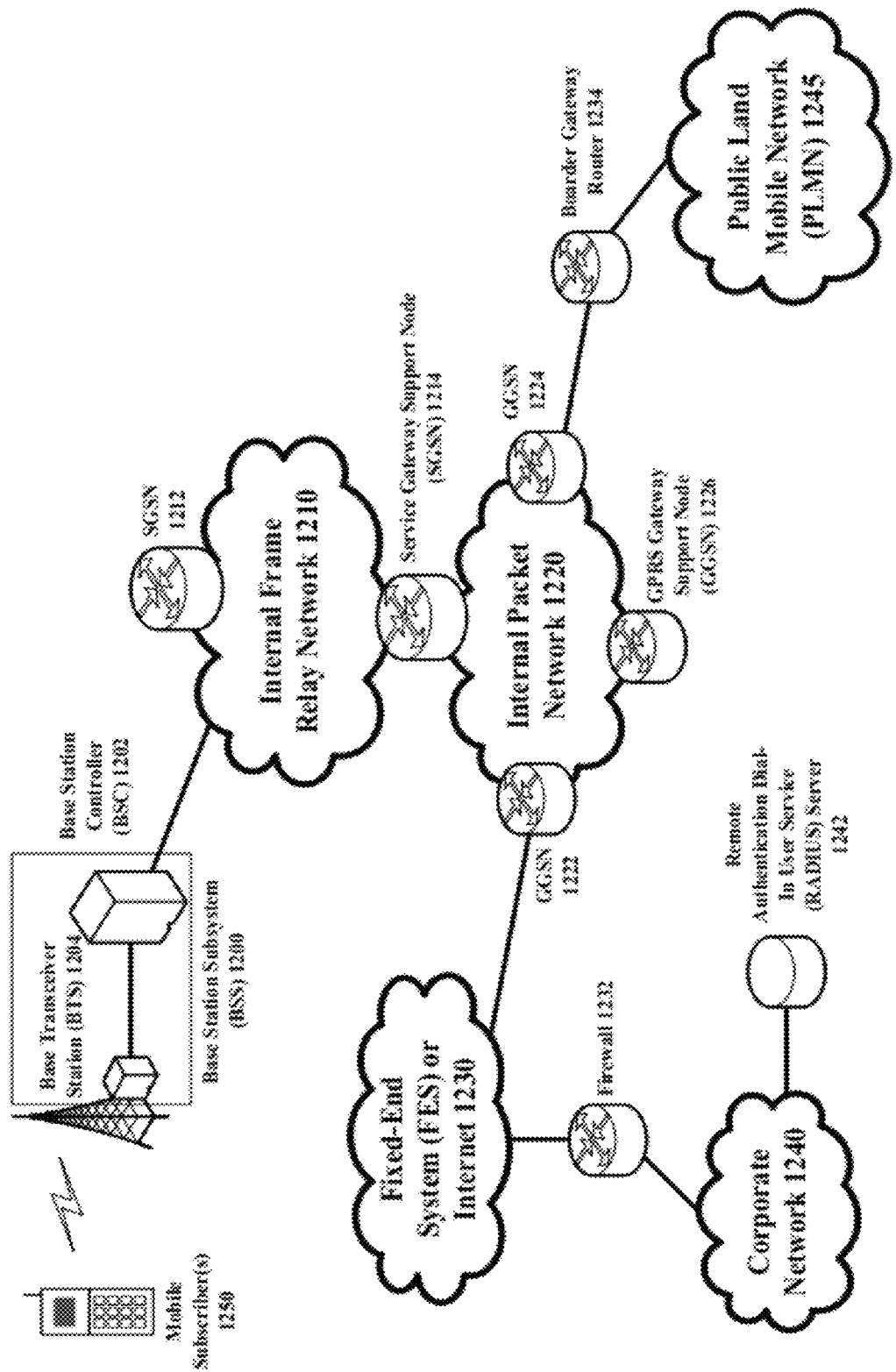
FIG. 12 illustrates an overview of a network environment suitable for service by one or more embodiments described herein.

FIG. 12 depicts an overall block diagram of an exemplary packet-based mobile cellular network environment, such as a GPRS network, in which one or more embodiments may be practiced. In such an environment, there are a plurality of Base Station Subsystems ("BSS") 1200 (only one is shown), each of which comprises a Base Station Controller ("BSC") 1202 serving a plurality of Base Transceiver Stations ("BTS") such as BTSs 1204, 1206, and 1208. BTSs 1204, 1206, 1208, etc. are the access points where users of packet-based mobile devices become connected to the wireless network. In exemplary fashion, the packet traffic originating from user devices is transported over the air interface to a BTS 1208, and from the BTS 1208 to the BSC 1202. Base station subsystems, such as BSS 1200, are a part of internal frame relay network 1210 that may include Service GPRS Support Nodes ("SGSN") such as SGSN 1212 and 1214.

Each SGSN is in turn connected to an internal packet network 1220 through which a SGSN 1212, 1214, etc. can route data packets to and from a plurality of gateway GPRS support nodes (GGSN) 1222, 1224, 1226, etc. As illustrated, SGSN 1214 and GGSNs 1222, 1224, and 1226 are part of internal packet network 1220. Gateway GPRS serving nodes 1222, 1224 and 1226 mainly provide an interface to external Internet Protocol ("IP") networks such as Public Land Mobile Network ("PLMN") 1245, corporate intranets 1240, or Fixed-End System ("FES") or the public Internet 1230. As illustrated, subscriber corporate network 1240 may be connected to GGSN 1224 via firewall 1232; and PLMN 1245 is connected to GGSN 1224 via boarder gateway router 1234. The Remote Authentication Dial-In User Service ("RADIUS") server 1242 may be used for caller authentication when a user of a mobile cellular device calls corporate network 1240.

Generally, there can be four different cell sizes in a GSM network—macro, micro, pico and umbrella cells. The coverage area of each cell is different in different environments. Macro cells can be regarded as cells where the base station antenna is installed in a mast or a building above average roof top level. Micro cells are cells whose antenna height is under average roof top level; they are typically used in urban areas. Pico cells are small cells having a diameter is a few dozen meters; they are mainly used indoors. On the other hand, umbrella cells are used to cover shadowed regions of smaller cells and fill in gaps in coverage between those cells.

Thus, network elements that may implicate the functionality of the optimization algorithms and processes in accordance with the invention may include but are not limited to Gateway GPRS Support Node tables, Fixed End System router tables, firewall systems, VPN tunnels, and any number of other network elements as required by the particular digital network.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

Various implementations of the invention described herein may have aspects that are wholly in hardware, partly in hardware and partly in software, as well as in software. As used herein, the terms "component," "system" and the like are likewise intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on computer and the computer can be a component. One or more components may reside within a process and/or thread of execution and a component may be localized on one computer and/or distributed between two or more computers.

Thus, the methods and apparatus of the present invention, or certain aspects or potions thereof, may take the form of program code (i.e., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. In the case of program code execution on programmable computers, the computing device generally includes a processor, a storage medium readable by the processor (including volatile and non-volatile memory and/or storage elements), at least one input device, and at least one output device.

Furthermore, the disclosed subject matter may be implemented as a system, method, apparatus, or article of manufacture using standard programming and/or engineering techniques to produce software, firmware, hardware, or any combination thereof to control a computer or processor based device to implement aspects detailed herein. The terms "article of manufacture", "computer program product" or similar terms, where used herein, are intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick). Additionally, it is known that a carrier wave can be employed to carry computer-readable electronic data such as those used in transmitting and receiving electronic mail or in accessing a network such as the Internet or a local area network (LAN).

The aforementioned systems have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components, e.g., according to a hierarchical arrangement. Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but generally known by those of skill in the art.

In view of the exemplary systems described supra, methodologies that may be implemented in accordance with the disclosed subject matter will be better appreciated with reference to the various flowcharts represented by the Figures. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, may be implemented which achieve the same or a similar result. Moreover, not all illustrated blocks may be required to implement the methodologies described hereinafter.

Furthermore, as will be appreciated various potions of the disclosed systems above and methods below may include or consist of artificial intelligence or knowledge or rule based components, sub-components, processes, means, methodologies, or mechanisms (e.g., support vector machines, neural networks, expert systems, Bayesian belief networks, fuzzy logic, data fusion engines, classifiers . . . ). Such components, inter alia, can automate certain mechanisms or processes performed thereby to make potions of the systems and methods more adaptive as well as efficient and intelligent.

While the present invention has been described in connection with the preferred embodiments of the various figures, it is to be understood that other similar embodiments may be used or modifications and additions may be made to the described embodiment for performing the same function of the present invention without deviating therefrom.

While exemplary embodiments refer to utilizing the present invention in the context of particular programming language constructs, specifications, or standards, the invention is not so limited, but rather may be implemented in any language to perform the optimization algorithms and processes. Still further, the present invention may be implemented in or across a plurality of processing chips or devices, and storage may similarly be affected across a plurality of devices. Therefore, the present invention should not be limited to any single embodiment, but rather should be construed in breadth and scope in accordance with the appended claims.

What is claimed is:

1. A method, comprising:
   encoding a first message;
   decoding a second message from a cooperating device;
   re-encoding at least a potion of the second message from the cooperating device with at least a potion of the first message to form a combined message; and
   transmitting at least a subset of the combined message over a single channel.

2. The method of claim 1, wherein the transmitting includes transmitting at least a potion of the combined message to a base station.

3. The method of claim 2, wherein the transmitting at least the potion includes transmitting the first message to the base station.

4. The method of claim 1, further comprising detecting a decoding failure.

5. The method of claim 4, wherein the transmitting includes transmitting the first message in response to detecting the decoding failure.

6. A device, comprising:
   a wireless communications component configured to receive at least one message from a cooperating device;
   an encoder configured to encode a message generated by the device; and
   a decoder configured to decode the at least one message from the cooperating device into at least one decoded message,
   wherein the encoder re-encodes at least a potion of the at least one decoded message together with at least a potion of the message to form a combined message for transmission over a single channel.

7. The device of claim 6, wherein the combined message is based on a recursive systematic convolutional inner code.

8. The device of claim 6, wherein the combined message is based on a cooperative serial concatenated convolutional code.

9. The device of claim 6, wherein the wireless communications component is configured to transmit at least a potion of the combined message to a base station.

10. The device of claim 9, wherein the wireless communications component is configured to transmit the message generated by the device to the base station.

11. The device of claim 6, wherein the message generated by the device and the at least one message from the cooperating device comprise unique message block lengths.

12. The device of claim 6, wherein the wireless communications component transmits one or more parity bits of the combined message over the single channel.

13. The device of claim 6, wherein the encoder or the decoder includes a pseudo-random interleaver.

14. The device of claim 6, wherein the encoder re-encodes at least the potion of the at least one decoded message and at least a potion of another decoded message from another cooperating device together with at least the potion of the message to form the combined message.

15. A non-transitory computer-readable storage medium having computer-executable instructions stored thereon that, in response to execution, cause a computing system to perform operations, comprising:
- encoding a first message;
- decoding a second message from a partner device;
- re-encoding at least a potion of the second message from the partner device with at least a potion of the first message to form a joint message; and
- transmitting at least a potion of the joint message over a single channel.

16. The non-transitory computer-readable storage medium of claim 15, further comprising transmitting at least a potion of the joint message to at least one other device.

17. The non-transitory computer-readable storage medium of claim 15, further comprising transmitting the first message to at least one other device.

18. The non-transitory computer-readable storage medium of claim 15, further comprising detecting a communications failure.

19. The non-transitory computer-readable storage medium of claim 18, further comprising transmitting the first message in response to detecting the communications failure.

20. A system, comprising:
- means for encoding a first message;
- means for decoding a second message from a cooperating device;
- means for re-encoding at least a potion of the second message from the cooperating device with at least a potion of the first message to form a combined message; and
- means for transmitting at least a subset of the combined message over a single channel.

\* \* \* \* \*